United States Patent [19]

Edwards et al.

[11] Patent Number: 5,495,554
[45] Date of Patent: Feb. 27, 1996

[54] ANALOG WAVELET TRANSFORM CIRCUITRY

[75] Inventors: R. Timothy Edwards; Michael D. Godfrey, both of Palo Alto, Calif.

[73] Assignee: Zilog, Inc., Campbell, Calif.

[21] Appl. No.: 1,802

[22] Filed: Jan. 8, 1993

[51] Int. Cl.$^6$ .................................................. G10L 3/02
[52] U.S. Cl. .......................... 395/2.14; 395/2.1; 395/2.15; 395/2.36; 364/485
[58] Field of Search ............................... 395/2, 2.1, 2.14, 395/2.15, 2.16, 2.36; 381/48, 49, 34, 29; 364/485, 481, 487

[56] References Cited

U.S. PATENT DOCUMENTS

| | | | |
|---|---|---|---|
| 4,449,209 | 5/1984 | Zehner et al. | 367/102 |
| 4,817,182 | 3/1989 | Adelson et al. | 382/56 |
| 4,974,187 | 11/1990 | Lawton | 364/728.01 |
| 5,014,134 | 5/1991 | Lawton et al. | 358/261.3 |
| 5,101,446 | 3/1992 | Resnikoff et al. | 382/56 |
| 5,124,930 | 6/1992 | Nicolas et al. | 364/485 |
| 5,214,708 | 5/1993 | McEachern | 381/48 |
| 5,262,958 | 11/1993 | Chui et al. | 364/487 |

OTHER PUBLICATIONS

The Wavelet Transform—A CMOS VLSI ASII Implementation Hoyt et al. IEEE/Aug. 1992.
High–Fidelity Audio Compression: Fractional–Band Wavelets Heegard et al. IEEE/Mar. 1992.
An Analog Wavelet Transform Chip Edwards et al. IEEE/Mar.–Apr. 1993.
"Interpretations of the Wavelet Transform"by H. L. Resnikoff and C. S. Burrus, *Twenty–Fourth Asilomar Conference on Signals, Systems & Computers, Conference Record, Computer Society Order No. 2180, Library of Congress No. 2180, Library of Congress No. 90–0112987*, ISEN 0–8186–2180–4, vol. 1 of 2, Nov. 5–7, 1990, pp. 94–97.

"Wavelets and Dilation Equations: A Brief Introduction" by Gilbert Strang, Dept. of Mathematics, Massachusetts Institute of Technology, Cambridge Mass. 02139, *SIAM Review, 1989 Society for Industrial and Applied Mathematics*, vol. 31, No. 4, pp. 614–627, Dec. 1989.
"Transconductance Amplifier", Static Functions, Aggregating Signals, Second–Order Section, by C. Mead, *Analog VLSI and Neural Systems*, Reading, Ma., Addison–Wesley (1989), pp. 67–80, 90–96, 105–107, 179–192.
"Reading and Understanding Continuous Wavelet Transforms," by A. Grossmann, R. Kronland–Martinet, and J. Morlet, *Wavelets: Time–Frequency Methods and Phase Space*, Springer–Verlage (1989), pp. 2–20.
"Adaptive Chirplet Representation of Signals on Time–Frequency Plane," by R. Bracewell, *Electronics Letters*, vol. 27, No. 13, Jun. 1991, pp. 1159–1161.
"Modern Techniques of Power Spectrum Estimation," by C. Bingham, M. D., Godfrey and J. W. Tukey, *IEEE Transactions on Audio and Electroacoustics*, vol. AU–15, No. 2, Jun. 1967, pp. 56–66.
"Circuits, Signals, and Systems," by Siebert, William McC., Cambridge, MA, *The MIT Press*, (1986), pp. 496–497.
"Theory of Communication," by D. Gabor, Dr. Ing., *British Thomson–Houston Co., Ltd., Research Laboratory*, revised edition, (24th Sep., 1945) pp. 429–457.

*Primary Examiner*—Allen R. MacDonald
*Assistant Examiner*—Richemond Dorvil
*Attorney, Agent, or Firm*—Majestic, Parsons, Siebert & Hsue

[57] ABSTRACT

An analog circuit implementing a continuous wavelet transform forms a multiplicity of analog wavelet outputs. These analog wavelet outputs can be used for data compression. This analog circuit is estimated to be about one-hundredth (1/100) the size and power of a digital wavelet transform circuit. Additionally, the analog wavelet outputs of the analog wavelet transform chip is directly determined without the loss of information due to the digital sampling.

11 Claims, 11 Drawing Sheets

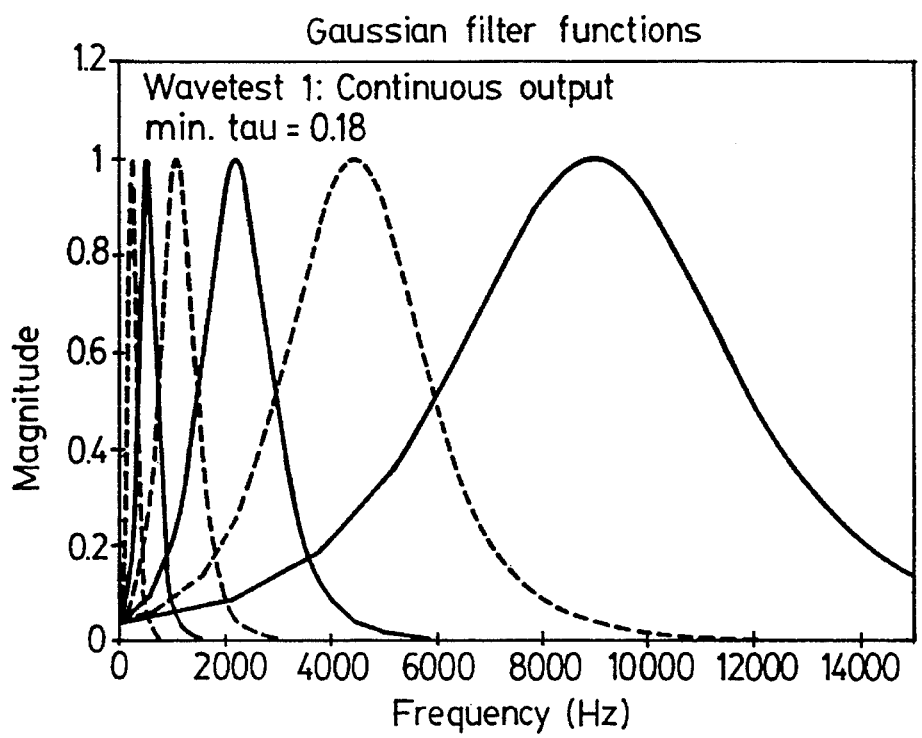
FIG._2(a).
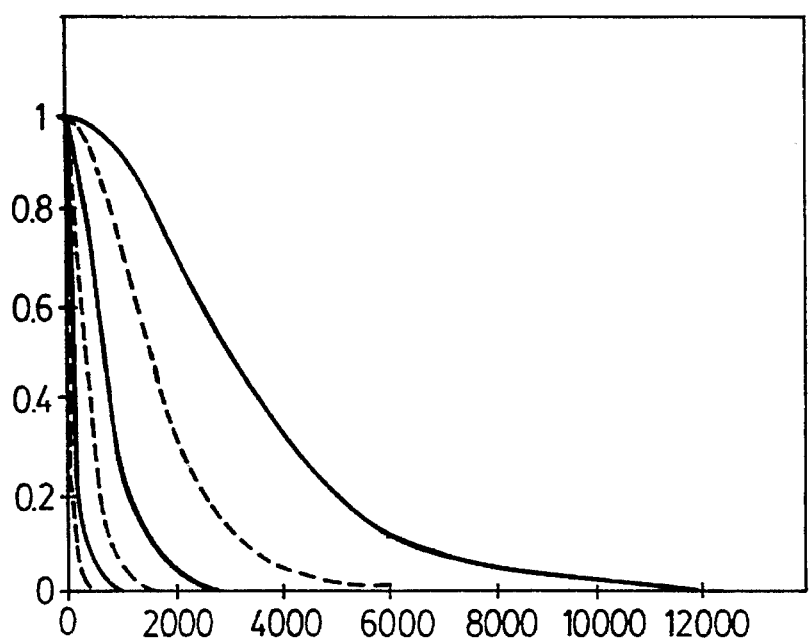
FIG._2(b).

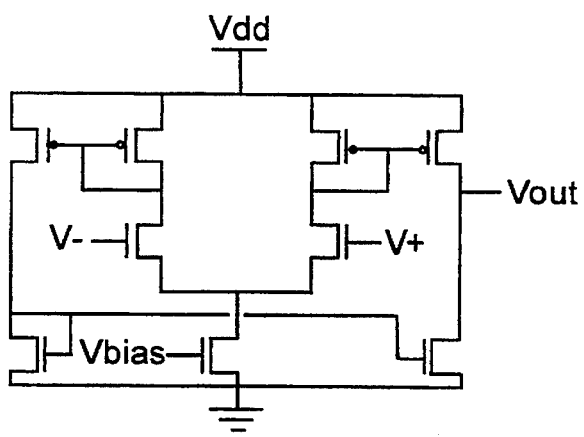
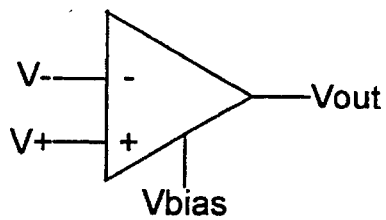
Schematic
FIG. 6(A)
Symbol
FIG. 6(B)
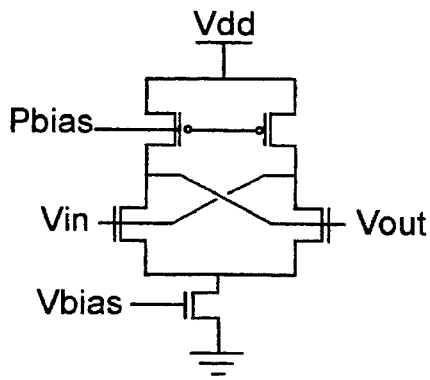
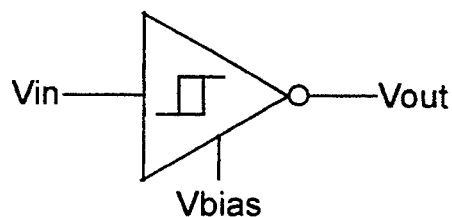
Schematic
FIG. 7(A)
Symbol
FIG. 7(B)
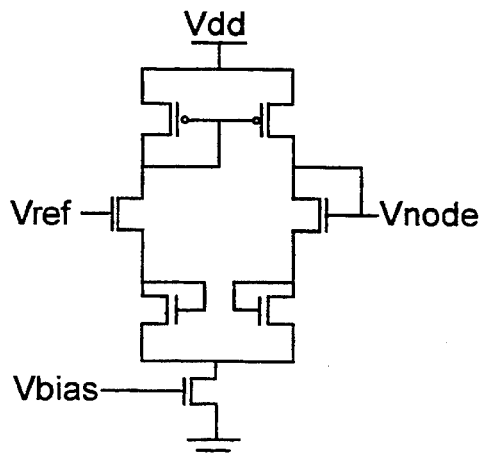
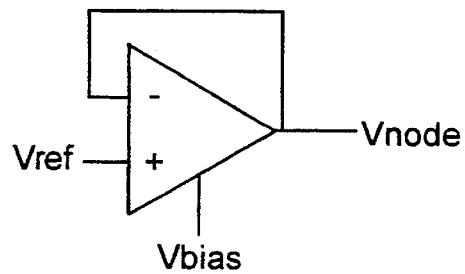
Schematic
FIG. 8(A)
Symbol
FIG. 8(B)

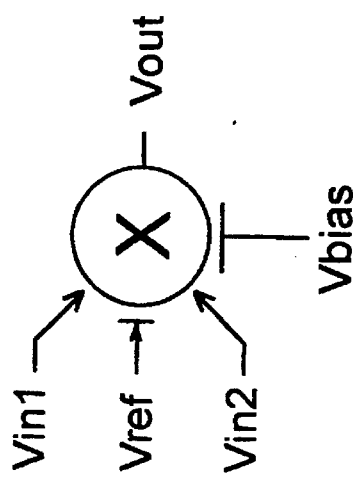
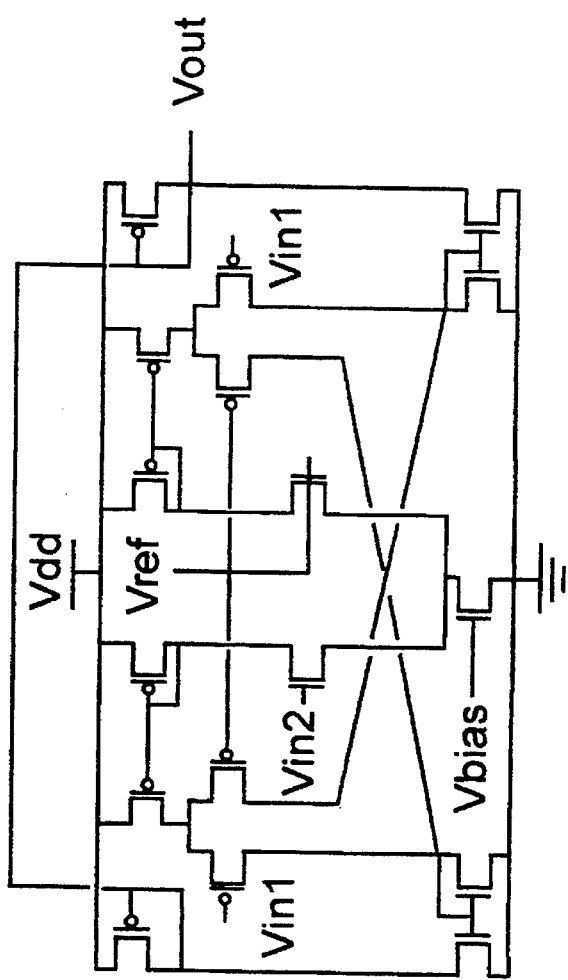
Schematic
FIG. 11(a)
Symbol
FIG. 11(b)

5,495,554

ANALOG WAVELET TRANSFORM CIRCUITRY

BACKGROUND OF THE INVENTION

This invention relates in general to analog signal processing, and in particular to an analog circuit for decomposing an input signal into analog wavelet outputs.

Analysis of an input signal in terms of frequency and time was first suggested in D. Gabor, *Theory of Communication*. Gabor realized that the informational content of some signals such as speech signals depends on time variations as well as frequency variations.

About ten years ago, based on Gabor's work, French scientists studied the decomposition of a signal into components with respect to frequency and time. They devised an orthogonal decomposition where values are placed in a "box" such that these values are unrelated to one another. This decomposition is called the "wavelet transform". As opposed to the Fourier transform which is dependent on frequency, the wavelet transform is dependent on both frequency and time.

Wavelet transforms have been suggested for use in data compression. The wavelet transform arranges the signal information in a manner that will facilitate data compression. For this reason, the use of wavelet transforms will be desirable in projected new consumer electronics products, such as digital telephone answering machines, that require data compression.

Lawton, U.S. Pat. No. 4,974,187, describes a system that decomposes a digital input sequence into its digital wavelet transform. The disadvantages of a digital wavelet transform circuit such as the one used in Lawton is that a digital wavelet transform circuit is large and uses a lot of power. Additionally, the digital sampling of an analog input to form the digital input sequence loses some of the information of the input signal. It is therefore desirable to provide an improved wavelet transform chip in which the above-described difficulties are not present.

SUMMARY OF THE INVENTION

The present invention uses an analog circuit implementing the continuous wavelet transform to form analog wavelet outputs from an analog input signal. This analog circuit is estimated to be abut one-hundredth (1/100) the size and power consumption of a digital wavelet transform circuit. Additionally, the analog wavelet outputs are formed without the loss of information resulting from digital sampling.

An analog circuit comprising a bank of filters can produce analog wavelet outputs from an analog input signal. These analog wavelet outputs can be sampled to produce digital wavelet transform components that can be compressed by digital processor.

One aspect of the present invention uses filters which approximate Gaussian-shaped filter functions to form the analog wavelet outputs. The use of Gaussian-shaped filter functions produces well behaved results in the time domain. By contrast, a perfect bandpass filter in the frequency domain would produce a strange function in the time domain.

The analog circuit comprises a bank of filters acting as substantially Gaussian-shaped filters with different center frequencies. Additionally, the present invention uses complex demodulation so that a half-Gaussian-shaped filter design can be used to approximate the Gaussian-shaped filter functions with different center frequencies. In the preferred embodiment, the half-Gaussian shaped filters are comprised of a cascade of a number of follower-integrators.

Another aspect of the invention is directed to an apparatus comprising an analog circuit adapted to form a multiplicity of analog wavelet outputs from an analog input signal; a sampler for producing digitally sampled wavelet data from the multiplicity of analog wavelet outputs; and a processor for compressing the digitally sampled wavelet data into a reduced amount of digital data.

Still another aspect of the invention is directed to a method comprising the steps of filtering an input signal to produce a multiplicity of analog wavelet outputs; sampling said multiplicity of analog wavelet outputs to produce digitally sampled wavelet data; and compressing said digitally sampled wavelet data into a reduced amount of digital data.

BRIEF DESCRIPTION OF THE DRAWINGS

FIG. 2(a) is a graph of the Gaussian filter functions approximated by the analog wavelet chip in the preferred embodiment.

FIG. 2(b) is a graph of the filter functions of the substantially half-Gaussian shaped filters which can be used to approximate the Gaussian filter functions of FIG. 2(a) using complex demodulation.

FIG. 6(a) is a schematic of a wide-range differential transconductance amplifier used in the analog wavelet chip.

FIG. 6(b) is the symbol for the wide-range differential transconductance amplifier of FIG. 6(a).

FIG. 7(a) is a schematic of a hysteretic inverter/latch circuit used in the analog wavelet chip.

FIG. 7(b) is the symbol for the hysteretic inverter/latch circuit of FIG. 7 (a).

FIG. 8(a) is a schematic of a resistor amplifier-follower circuit used in the analog wavelet chip.

FIG. 8(b) is the symbol for the resistor amplifier-follower circuit of FIG. 8(a).

FIG. 11(a) is a schematic of a wide range four quadrant Gilbert multiplier used in the analog wavelet chip.

FIG. 11(b) is a symbol for the wide range four quadrant Gilbert multiplier of FIG. 11(a).

DETAILED DESCRIPTION OF THE PREFERRED EMBODIMENT

Figure 1:
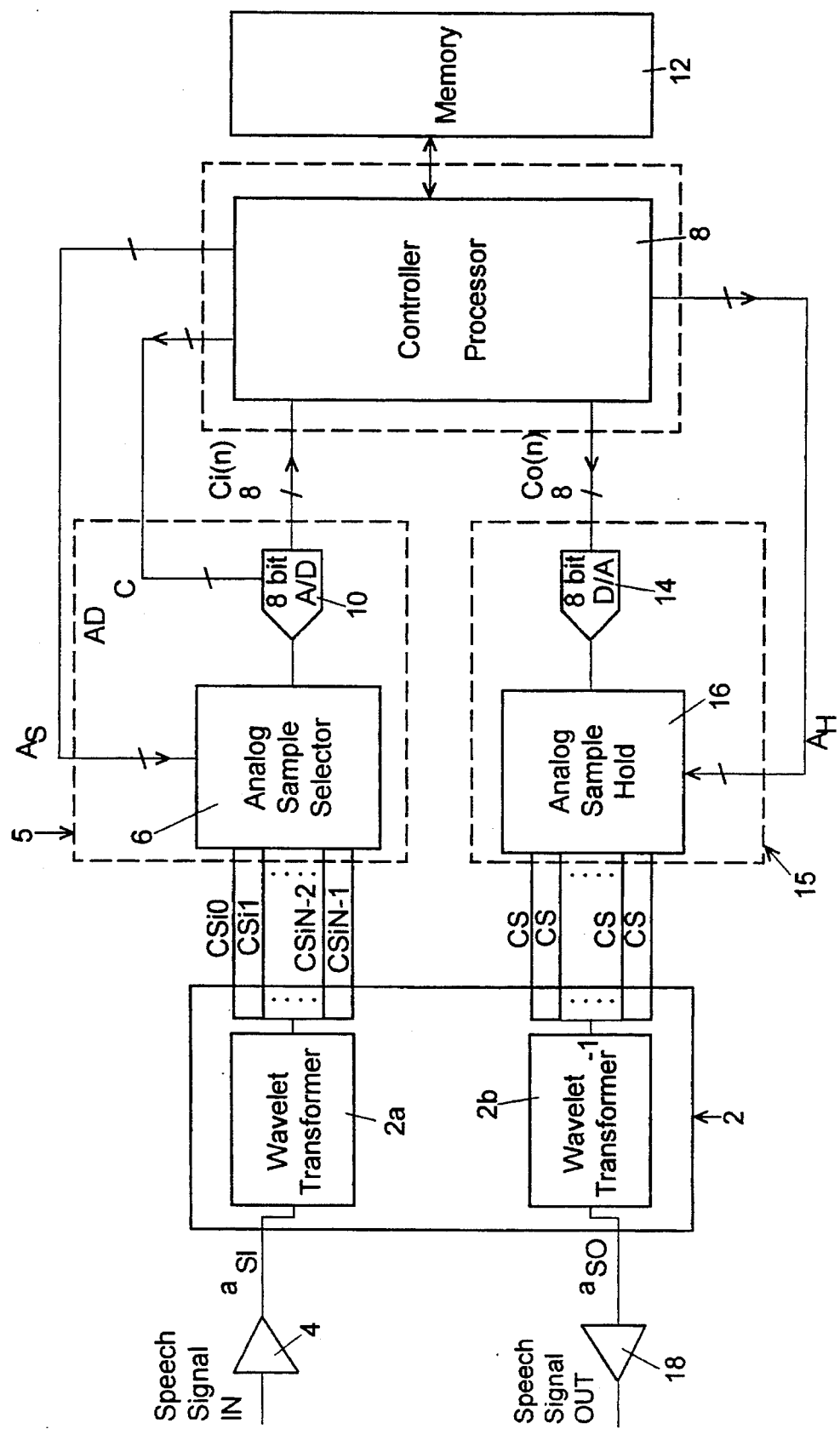
FIG. 1 is an schematic of the system of the present invention including an analog wavelet chip.

The continuous wavelet transform which produces analog wavelet outputs is an analog filtering function and is similar to what is known as the Gabor spectrogram. The continuous wavelet transform is discussed in A. Grossman, R. Kronland-Martinet, and J. Morlet., "Reading and Understanding Continuous Wavelet Transforms," Wavelets: Time-Frequency Methods and Phase Space, Springer-Verlag (1989), pp. 2–20. The continuous wavelet transform is not to be confused with the Discrete Wavelet Transform (DWT), which is a purely discrete-time algorithm and best implemented by digital means. The relationship between the continuous and discrete wavelet transforms is roughly equivalent to the relationship between the (continuous) Fourier Transform and the Discrete-Time Fourier Transform (DTFT), the latter which is often implemented using the Fast Fourier Transform algorithm (FFT), which itself is analogous to the Mallat pyramid algorithm most often used to implement the DWT.

The continuous wavelet transform arises out of the need for a continuous-time frequency description of a signal which also captures the time-varying nature of that description. In order to do this, the transform cannot be computed over all time, but must be computed over a windowed time interval. The desired frequency description implies that the frequency plane will also be divided into intervals.

The Continuous Wavelet Transform is implemented in the present invention using a gaussian function as the windowing function; this gaussian is a continuous, band-limiting function of both frequency and time. This transform implementation also divides up the time frequency plane into two-dimensional windows of equal area, which is a natural consequence of time frequency uncertainty, $\Delta f \Delta t = $ constant. Equal areas and proper tiling of the windowing functions are achieved by controlling the frequency bandwidth and center frequency of each gaussian.

The present invention uses an analog circuit to form an analog wavelet output from an analog input signal, such as a sound signal. The analog circuit comprises a bank of filters acting as substantially Gaussian-shaped filters. The analog implementation of the continuous wavelet transform has the advantages of substantially reduced size and power consumption over the Digital Wavelet Transform circuit. It is estimated that an analog continuous wavelet transform circuit would be one hundredth (1/100) the size and power consumption of a digital wavelet transform circuit. The tradeoffs for these benefits include an inflexible algorithm, the requirement to deal with temperature sensitivity of the transistors, variable process parameters and noise injection throughout the circuit.

The benefit of using Gaussian-shaped filter functions is that the Gaussian function looks like a Gaussian in both the frequency and time domains. By contrast, bandpass filters that are rectangular in the frequency domain, such as the filters used in audio mixers, have a strange shape in the time domain. Since the Gaussian function is well behaved in both the frequency and time domains, it is easy to put the information in the frequency-time representation's "boxes". The substantially Gaussian-shaped filter functions approximated in the analog wavelet chip are finite approximations of the Gaussian function. Additionally, as discussed below, the preferred embodiment uses complex demodulation and substantially half-Gaussian shaped filters to approximate the substantially Gaussian-shaped filter functions.

FIG. 1 is a schematic of the system of the present invention including an analog wavelet chip 2. An input speech signal can be amplified in amplifier 4 and sent to the analog wavelet transformer circuitry 2a. The analog wavelet transformer circuitry 2a forms analog wavelet outputs from the analog input signal. As described below, the analog wavelet transformer circuitry 2a approximates substantially Gaussian-shaped filter functions to form the analog wavelet outputs.

Figure 3:
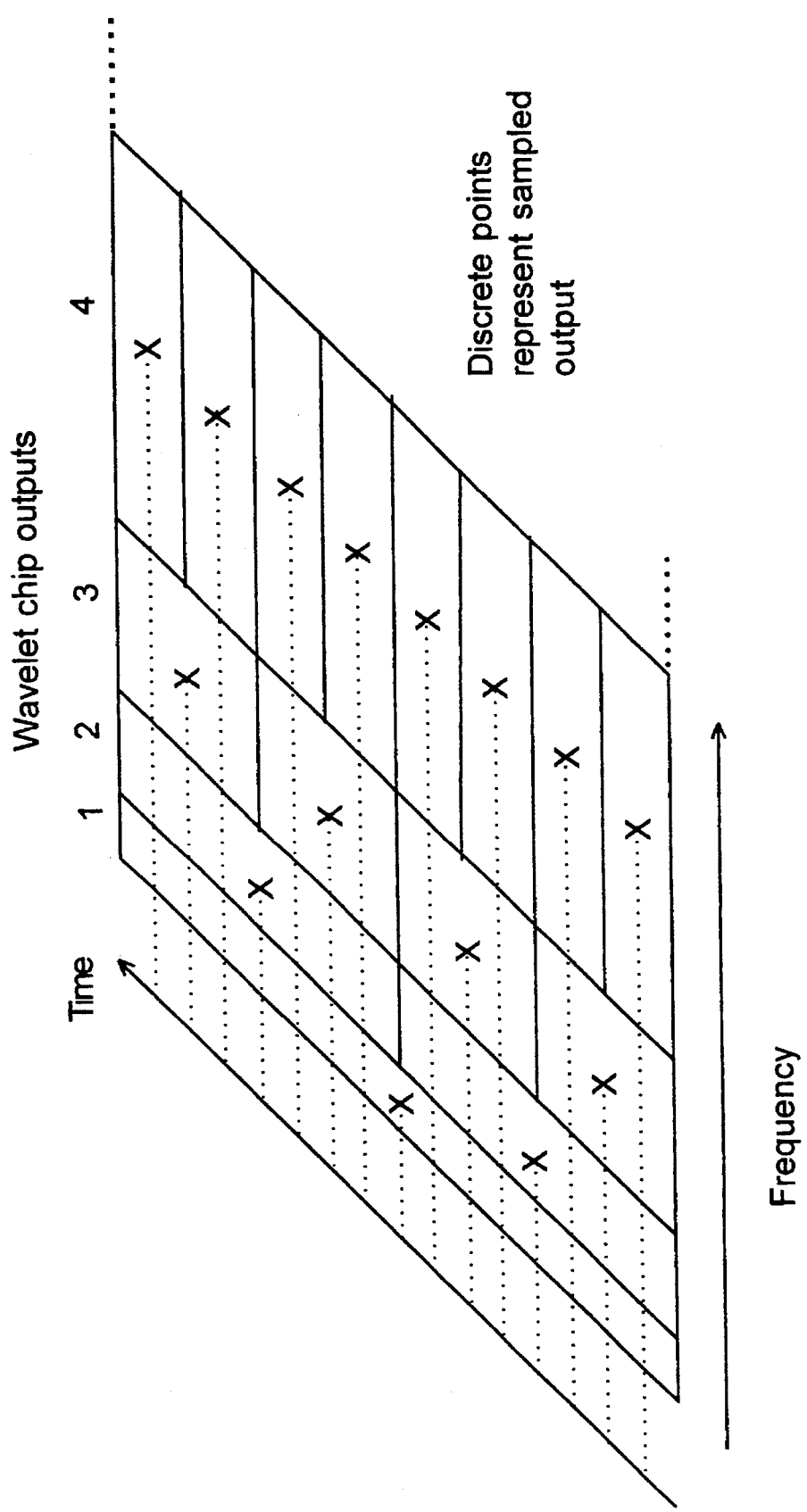
FIG. 3 is a graph showing the frequency-time representation output of some of the analog wavelet outputs of the present invention.

These analog wavelet outputs are sent to a sampler 5. The sampler 5 is comprised of an analog sample selector 6 and an analog-to-digital converter 10. The analog sample selector 6 and the analog-to-digital converter 10 are under the control of a controller processor 8. The analog sample selector 6 selects a analog wavelet output signal to send to the analog-to-digital converter 10. Since the analog-to-digital converter 10 samples at 100 kHz, the analog-to-digital converter 10 can sample the signals from all the filters (not shown) in the analog wavelet transformer circuitry 2a. FIG. 3 described below shows how the sampling of the analog wavelet outputs can be time dimension multiplexed. In the preferred embodiment, since the analog-to-digital converter 10 can sample at 100 Hz, much faster than the Nyquist frequency of the largest bandwidth output in the preferred embodiment, both the real and imaginary outputs for all six frequency bands outputs can be sampled.

Looking again at FIG. 1, the sampler 5 can sample the analog wavelet outputs at the Nyquist frequency of each of the filters (not shown) in the analog wavelet transformer circuitry 2a to form digitally sampled wavelet data. The controller processor 8 receives a frame of a certain number of sets of digitally sampled wavelet data from the sampler 5. The controller processor 8 does data compression on this frame to produce a reduced amount of digital data.

One way to do data compression is to do a differential encoding in which the difference between the digitally sampled wavelet data from one set in the frame and the digitally sampled wavelet data from the previous set in the frame is stored. Another type of data compression discards the digitally sampled wavelet data that is not needed.

The controller processor 8 can then store the reduced amount of digital data in the memory 12. This memory 12 can be either external or internal to the chip with the controller processor 8.

Later, the controller processor 8 can decompress the reduced amount of digital data to form decompressed digital data. This decompressed digital data is sent to circuitry 15 that produces reconstituted analog wavelet outputs. The circuitry 15 comprises an digital-to-analog converter 14 and an analog sample-and-hold 16. The digital-to-analog converter 14 produces an analog signal from the reconstituted digital data. The analog sample-and-hold 16 then samples this analog signal to send reconstituted analog wavelet outputs to the correct input of the wavelet transformer circuitry 2b of the analog wavelet transform chip 2. The analog sample-and-hold 16 is under the control of the controller processor 8.

The output of the wavelet transformer circuitry 2b is a reconstituted analog input signal produced from the reconstituted analog wavelet outputs. This output of the wavelet transformer circuitry 2b can amplified in amplifier 18.

The apparatus shown in FIG. 1 can be used in a digital answering machine or in other consumer electronics goods.

FIG. 2(a) is a graph of the substantially Gaussian filter functions with different center frequencies approximated by the present invention. The center frequencies of the filter functions used by the analog wavelet chip 2, shown in FIG. 1, are spaced on a $\log_2$ scale as shown in the graph of FIG. 2(a). Spacing the center frequencies of the filter functions on a logarithmic scale is a convenient way to arrange the information content of speech signals. In the preferred embodiment, the center frequencies of the substantially Gaussian filter functions are at 9 kHz, 4.5 kHz, 2.25 kHz, 1.125 kHz, 562.5 Hz and 281.25 jHz. The bandwidth of each substantially Gaussian filter is set on a logarithmic scale as well. The Gaussian filter functions overlap those in adjacent bands to prevent the overall frequency domain transfer function from having notches. Note that the Gaussian filter functions approximately add up to a constant function between the lowest and highest center frequency.

FIG. 3 is a graph showing the frequency-time representation output of some of the analog wavelet outputs of the present invention. If the outputs of the analog wavelet chip are sampled at the points X marked on the frequency-time representation, notice that the sampling of the analog wavelet outputs can be easily time division multiplexed into an sampled output stream. Each "box" in the time frequency plane has an equal area so each sample is of equal value. When the Analog wavelet outputs are sampled at these locations digital wavelet coefficients are formed. In the preferred embodiment, both real and imaginary outputs are sampled.

Figure 4:
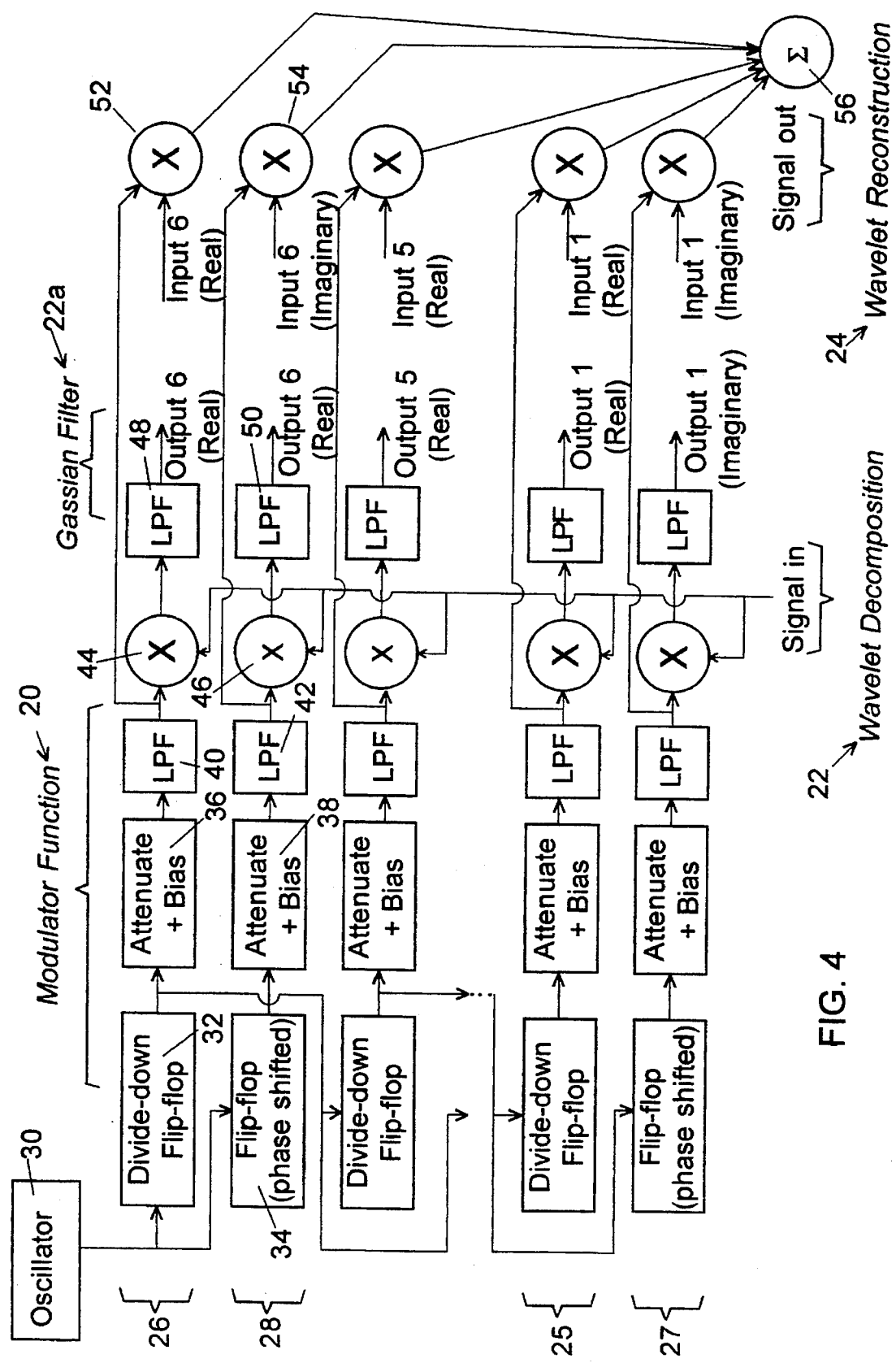
FIG. 4 is a partial block diagram of the analog wavelet transform chip.

FIG. 4 is a partial block diagram of the analog wavelet transform chip. The analog wavelet transform chip has three main sections. A modulator function section 20, a wavelet decomposition section 22 and a wavelet reconstruction section 24. The wavelet decomposition section 22 corresponds to the analog wavelet transformer circuitry 2a shown in FIG. 1. The wavelet reconstruction section 24 shown in FIG. 4, corresponds to the analog circuitry 2b shown in FIG. 1. In order to simplify the process of designing bandpass filters of adjustable center frequency and width, a complex demodulation process is used. The analog input signal is modulated by a signal with a frequency equal to the center frequency of the substantially Gaussian function that is desired to be approximated.

In this manner, the filters in the Gaussian filter section 22a may be half-Gaussian shaped filters which are in effect low pass filters. These half-Gaussian shaped filters are easier to design than designing a number of Gaussian shaped filters with different center frequencies. In effect, one design can be used for all the low pass filters in the Gaussian filter section 22a. The bandwidth of the low pass filters in the Gaussian filter section 22a can be set by the voltage, $V_{gauss}$, sent to the low pass filters of the Gaussian filter section 22a.

The method of complex demodulation is described below. The input function is designated by $f_{in}(t)$. In order to demodulate it with respect to some given frequency $\omega_c$ (one of the center frequencies of the wavelet decomposition), we can use the following multiplication:

$$f_{out}(t) = 2LPF(f_{in}(t)(\cos\omega_c t + i\sin\omega_c t))$$

Since the low-pass filter LPF() is assumed to be real, and $f_{in}(t)$ is real, then the output $f_{out}(t)$ must necessarily be complex, and can be represented by $$f_{out}(t) = f_{real}(t) + if_{imag}(t)$$

therefore, $$f_{real}(t) = 2LPF(f_{in}(t)\cos\omega_c t)$$

and $$f_{imag}(t) = 2LPF(f_{in}(t)\sin\omega_c t).$$

In other words, the "real" and "imaginary" parts are both results which are easily obtained by multiplying the input by two sinusoidal functions which are 90° out of phase with each other.

Looking at FIG. 4, "slice" 26 provides the real part of the analog wavelet output for the highest frequency filter and "slice" 28 provides the imaginary part for the highest frequency analog wavelet output. An oscillator 30 may be external or internal to the analog wavelet chip. This oscillator 30 provides a squarewave signal to a divide-down flip-flop 32 and to divide-down flip-flop 34. Divide-down flip-flop 34 produces an output which is phase shifted 90° from the output of the divide down flip-flop 32.

The output of the divide down flip-flop 32 and the output of the divide down flip-flop 34 is then sent to the attenuate and bias sections 36 and 38, respectively, and to low pass filters 40 and 42, respectively. These low pass filters produce a sinusoidal output out of the squarewave signals from the attenuate and bias circuitry 36 and 38. The output of the low pass filter 40 is $\cos\omega_{c6} t$, and the output of the low pass filter 42 is $\sin\omega_{c6} t$. $\omega_{c6}$ is the center frequency of the Gaussian-shaped filter function of the highest frequency filter, which is in the preferred example, 9 kHz.

In the wavelet decomposition section 22, the input signal, $f_{in}(t)$, is multiplied by the $\cos\omega_{c6} t$ modulating signal in multiplier 44 and sent to the half-Gaussian shaped filter 48 to produce the real portion of the analog wavelet output for the highest frequency band, $f_{real6}(t)$. Additionally, the input signal is multiplied by the modulating signal, $\sin\omega_{c6} t$, in multiplier 46 and then filtered in the half-Gaussian shaped 50 to produce the imaginary portion of the analog wavelet output for the highest frequency band, $f_{imag6}(t)$.

Due to the complex demodulation process, the real and imaginary parts of the analog wavelet outputs are shifted to a lower frequency. This will not effect the data compression because the frequency bandwidth of the analog wavelet outputs contains the information content of the analog wavelet outputs. The frequencies of the analog wavelets are later shifted back in the wavelet reconstruction section 24 as described below.

The modulator function section 20 produces sine and cosine modulating pairs for modulating the analog input signal. The output of the divide down flip-flop 32 is sent to another set of flip-flops. In this manner, the frequency of the modulating pairs for the next set of output "slices" is one half that of the previous set of output "slices". Thus, a pair of modulating sinusoidal signals which are 90° out of phase from one another can be created for the real and imaginary part of all six filter bands. In the preferred embodiment, there are six sine and cosine modulating pairs with frequencies $\omega_{c6}=9$ kHz, $\omega_{c5}=4.5$ kHz, $\omega_{c4}=2.25$ kHz, $\omega_{c3}=1.125$ kHz, $\omega_{c2}=562.5$ Hz and $\omega_{c1}=281.25$ Hz. In general, the use of divide-by-n flip flops, such as flip-flops 26 and 28, allows for the center frequencies of the substantially Gaussian filter functions to be logarithmically spaced.

In order to remodulate the signal back to its original frequency, the following multiplication is performed:

$$f_{remod}(t) = f_{out}(t)(\cos\omega_c t - i\sin\omega_c t)$$

This is the same function as the demodulation except for the change in sign. We multiply out the real and imaginary parts of this equation to get a purely real result, which is the (exact) reconstruction of the original input:

$$f_{remod}(t)=f_{real}(t)\cos\omega_c t+f_{imag}(t)\sin\omega_c t.$$

Here the signs have worked out such that the remodulating sinusoidal signals have exactly the same phase relation as the demodulating sinusoidal signals. Note that no low-pass filter is needed for reconstruction.

The reconstruction of the input signal is done in the wavelet reconstruction section 24. The real part of the reconstructed analog wavelet output for "slice" 26 of the analog wavelet transform chip, $f_{real6}(t)$, is multiplied by the modulating signal, $\cos\omega_{c6}t$, in the multiplier 52. The imaginary part of the reconstructed analog wavelet output for "slice" 28 of the analog wavelet chip, $f_{imag6}(t)$ is multiplied by the modulating signal, $\sin\omega_c t$, in multiplier 54. The summation of the signals from multipliers 52 and 54 produce a remodulated signal, $f_{remod6}(t)$.

Looking again at FIG. 2(a), the six Gaussian filters functions are chosen such that the Gaussian filter functions sum into an approximately constant function over the frequencies between the 9 kHz and 281.25 Hz. For this reason, looking at FIG. 4, the summation of the remodulated signals $f_{remod6}(t)$, $f_{remod5}(t)$, $f_{remod4}(t)$, $f_{remod3}(t)$, $f_{remod2}(t)$, and $f_{remod1}(t)$ in summer 56 produces a reconstituted input signal.

Figure 5:
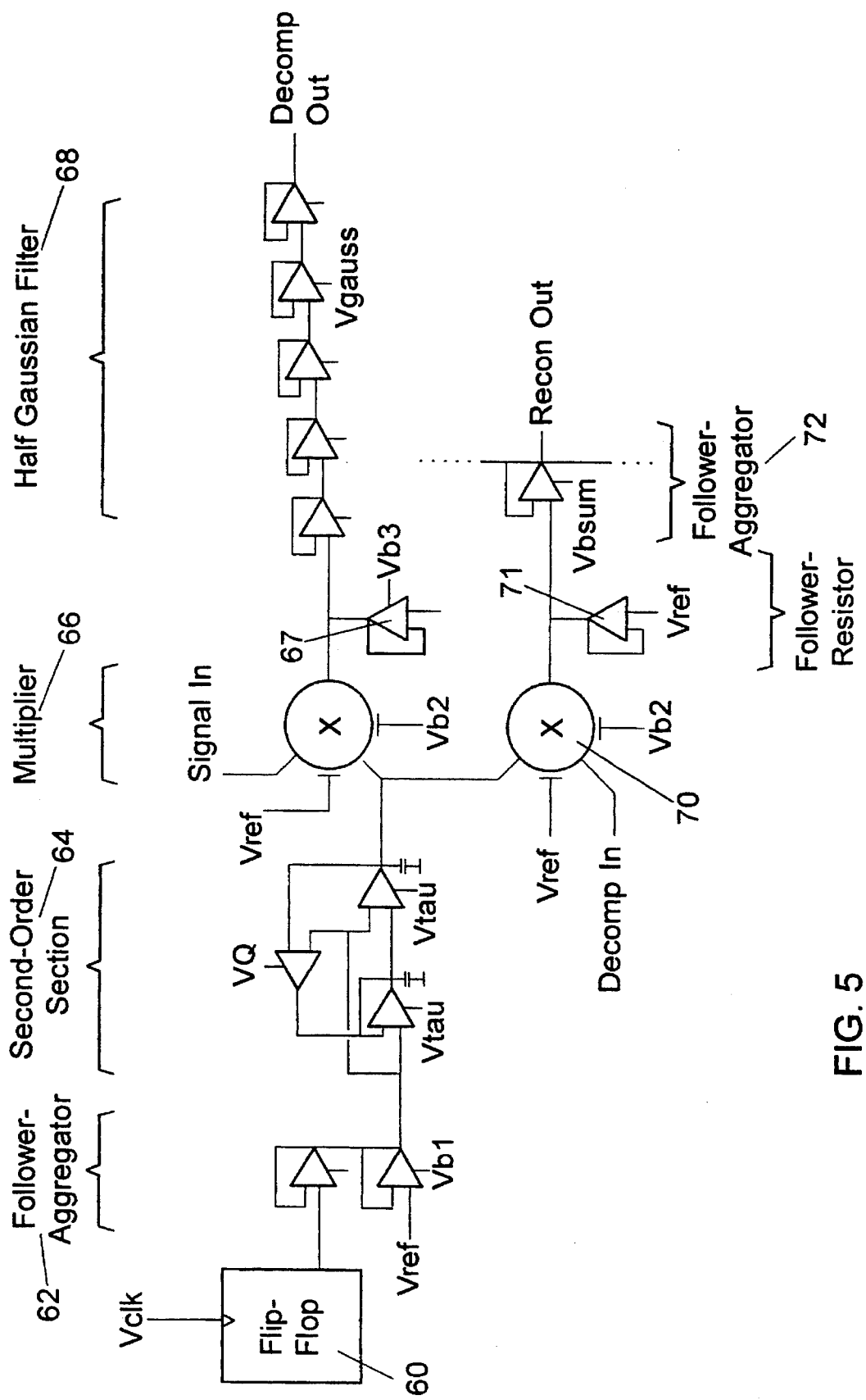
FIG. 5 is schematic diagram of one "slice" of the analog wavelet transform chip shown in FIG. 4.

FIG. 5 is a schematic diagram of one "slice" of the analog wavelet transform chip shown in FIG. 4. In the preferred environment, there are 12 such "slices" real and imaginary parts of six outputs. This "slice" contains the divide down flip-flop 60 that halves the frequency of a signal input to the flip-flop. A follower aggregator 62 is used to bias and attenuate the clock signal from the flip-flop 60. A second order section 64 acts as a low pass filter to produce a sinusoidal wave from the square-wave input. Additionally, a multiplier 66 multiplies input signal, $f_{in}(t)$, with the modulating signal from the second order section 64. The substantially half-Gaussian filter 68 filters this multiplied signal to produce the real or imaginary portion of an analog wavelet output.

A reconstituted analog wavelet output is sent to the multiplier 70 which multiplies this reconstituted analog wavelet output with the modulated signal from the second order section 64 to form a demodulated signal. This demodulated signal is then added to the demodulated signals from the other "slices" in the follower-aggregator 72 to produce a reconstituted analog input signal.

In the complex demodulation process, the analog input signal is modulated with a modulating signal of the center frequency of desired passband. For this reason, it is only necessary to use a substantially half-Gaussian filter, which is in effect a type of low pass filter. When the signals are remodulated to their respective center frequencies, this half-Gaussian shaped filter will behave as if it were reflected symmetrically across the modulation frequency, becoming a band-pass filter with Gaussian characteristics. FIG. 2(b) is a graph of the filter functions of the substantially half-Gaussian shaped filters which can be used to approximate the Gaussian filter functions of FIG. 2(a) using complex demodulation.

Design of the half-Gaussian shaped filter is based upon a probability argument. The following transfer function describes the filter of the preferred embodiment:

$$H(s)=\frac{V_{out}}{V_{in}}=\left(\frac{1}{\tau s+1}\right)^n$$

This filter consists of a cascade of n follower-integrator sections in series. Although the above expression converges to a delta function in the limit as n goes to infinity for constant $\tau$, it can also be shown that when $\tau$ is replaced by an expression which maintains constant bandwidth, the transfer function approaches a Gaussian function as n goes to infinity:

$$H(s)=\frac{V_{out}}{V_{in}}\approx e^{-\frac{\omega^2}{2\sigma^2}}$$

where $s=j\omega$.

A proof of this equation can be found in Siebert, *Circuits, Signals, and Systems,* p. 493–497, and shows that the Gaussian shape is an example of the central limit theorem; in other words, it is a result of the use of cascaded stages and is relatively independent of the shape of the filter.

Due to considerations of signal-to-noise ratio, and the ability to generate a given constant $\tau$ from a voltage applied to the follower-integrators, a cascade order of five sections was used in the preferred embodiment. For n=5 the relationship between $\tau$ and $\sigma$ is:

$$\sigma=1/\tau(0.5372).$$

The bandwidth of each half-Gaussian filter is automatically set with respect to the others with the exception of the first and last filters, which have bandwidths adjustable using two control voltages. In terms of the transfer function given above for the Gaussian low-pass filter, the parameters T of the highest- and lowest-frequency filters is fixed by these control inputs. $\tau$ and the effective center frequency of each filter band vary logarithmically across the bank. $\tau$ is set to assure that the width of each Gaussian filter function increases proportionally with the value of the center frequency.

Figure 16:
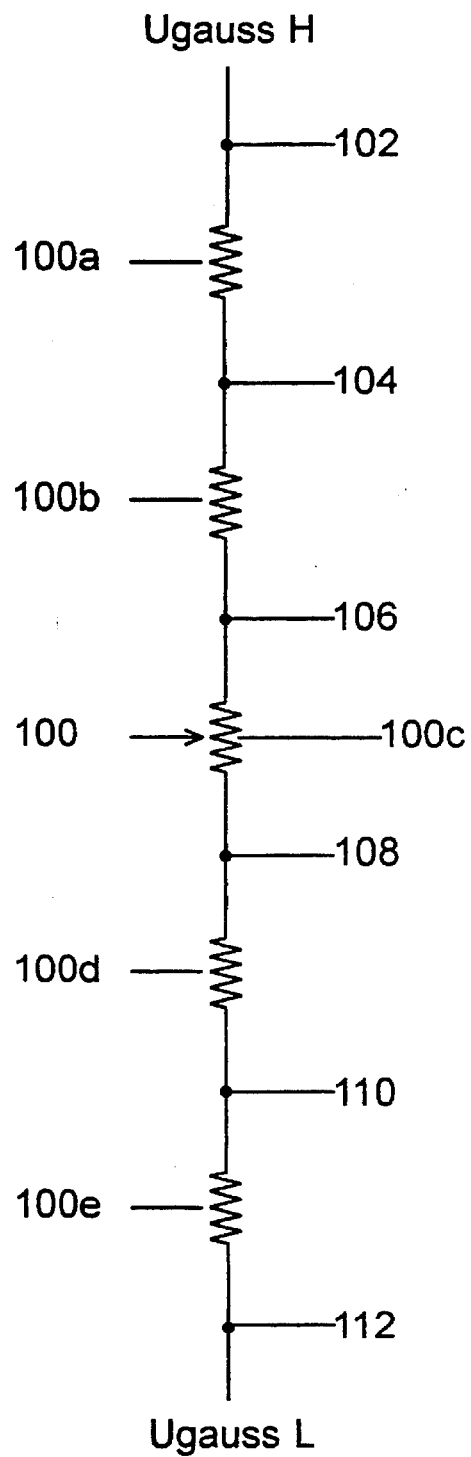
FIG. 16 is a schematic of a polysilicon strip showing the voltages, $V_{gauss}$, for the different "slices" of the analog wavelet chip.

FIG. 16(b) shows the use of a polysilicon strip 100 to set the $V_{gauss}$ for real and imaginary "slices" of the filter bank for each of the 6 center frequencies. The sections 100a, 100b, 100c, 100d and 100e of the polysilicon strip 100 are equal in resistance so that the voltages $V_{gauss}$ at points 102, 104, 106, 108, 110 and 112 will have a linear relation. The bandwidth of these substantially half-Gaussian filters then will then vary exponentially in proportion with the value of the center frequency. Thus, the bandwidth for the real and the imaginary part of the highest frequency filter is twice the bandwidth of the real and the imaginary part for the next highest filter and so on.

Most of the circuits in the wavelet transform chip use transistors that operate in the sub-threshold region i.e., with the gate to source voltage below the threshold voltage of the transistor. In this region the current/voltage characteristics of a transistor follow an exponential function, rather than a square law function. The equation for the transistor in the subthreshold range is approximately:

$$I_{DS}\approx\left(\frac{W}{L}\right)I_o e^{\frac{V_{GS}\kappa}{V_T}}.$$

where $I_{ds}$ is the current through the transistor from the drain to the source, W/L is the width to length ratio of the transistor, $I_o$ is a pre-exponential constant. $V_{gs}$ is the gate source voltage. $\kappa$ is the gate efficiency constant, typically about 0.7 and $V_T$ is the thermal voltage equal to KT/q or approximately 25 mV.

FIGS. 6(a)–15 show the analog circuit building blocks used in the preferred embodiment of the present invention. FIG. 6(a) is a schematic of a wide-range differential transconductance amplifier used in the analog wavelet chip. This circuit is useful in a lot of analog Very Large Scale Integration (VLSI) situations and is used in the follower-aggregator 62, in the second order section 64, in the half-gaussian filter 68, and in the follower-aggregator 72 all shown in FIG. 5. This circuit is used in two different ways: First, as a current-output device, for which the output function is $$I_{out} = I_{bias} \tanh \frac{\kappa(V_+ - V_-)}{2}.$$

where $I_{bias}$ is the bias current. Second, the circuit acts as a voltage-output device, for which the (small signal) voltage gain is $$\frac{V_{out}}{(V_+ - V_-)} \approx \frac{g_{mn}}{(g_{0n} + g_{0p})}$$

which is on the order of 200 to 300. $g_{mn}$, $g_{0n}$, and $g_{0p}$ are values of the small signal model of a transistor. $g_{mn}$ is the n-channel metal-oxide-silicon (NMOS) transistor transconductance, and $g_{0n}$, and $g_{0p}$ are the NMOS and p-channel metal-oxide-silicon (PMOS) transistor shunt conductances, respectively. The large-signal output voltage in this case is fixed by bias circuitry at the amplifier output. The total current $I_{bias}$ through both sides of the differential amplifier is fixed by the bias voltage $V_{bias}$ according to the (simplified) transistor equation:

$$I_{bias} = \left(\frac{W}{L}\right) I_0 e^{\frac{V_{bias}\kappa}{V_T}};$$

this bias voltage is generally set to the range 0.6 V to 0.8 V, which keeps the transistor in the subthreshold region and restricts current through the circuit to the nanoamp range, but with the current high enough to keep the signal-to-noise ratio of the output large.

One of the major uses of the transconductance amplifier is the follower, in which the negative input V is tied to the output Vout, and for which $V_{out} \approx V_+$.

FIG. 7(a) is a schematic of a hysteretic inverter/latch circuit used in the analog wavelet chip. FIG. 7(b) is the symbol for this hysteretic inverter/latch circuit. This inverter is the low power analog VLSI equivalent of the latch. The bias voltage $V_{bias}$ is set to place the transistor in the sub-threshold region. In the wavelet transform chip, the hysteretic inverter/latch circuit is used to produce the oscillatory output for the modulators, so the hysteretic inverter/latch circuit's highest switching rate is on the order of 20 kHz. The switching points of the hysteretic inverter are close to power and ground, and can be adjusted slightly by altering the values of $P_{bias}$ and $V_{bias}$. Usual values for these parameters are $V_{bias}$=0.8 volts, and $P_{bias}$=4.3 volts.

FIG. 8(a) is a schematic of a resistor amplifier-follower circuit used in the analog wavelet chip. FIG. 8(b) is a symbol for the resistor amplifier-follower circuit of FIG. 8(a). The resistor amplifier-follower circuit is used to translate current into voltages in a linear fashion. A transconductance amplifier with a fairly low gain is connected as a follower and thus acts as follower aggregator. The low gain of the amplifier increases the region in which the effective resistance is linear. The resistor amplifier-follower is shown as elements 67 and 71 in FIG. 5.

Figure 9:
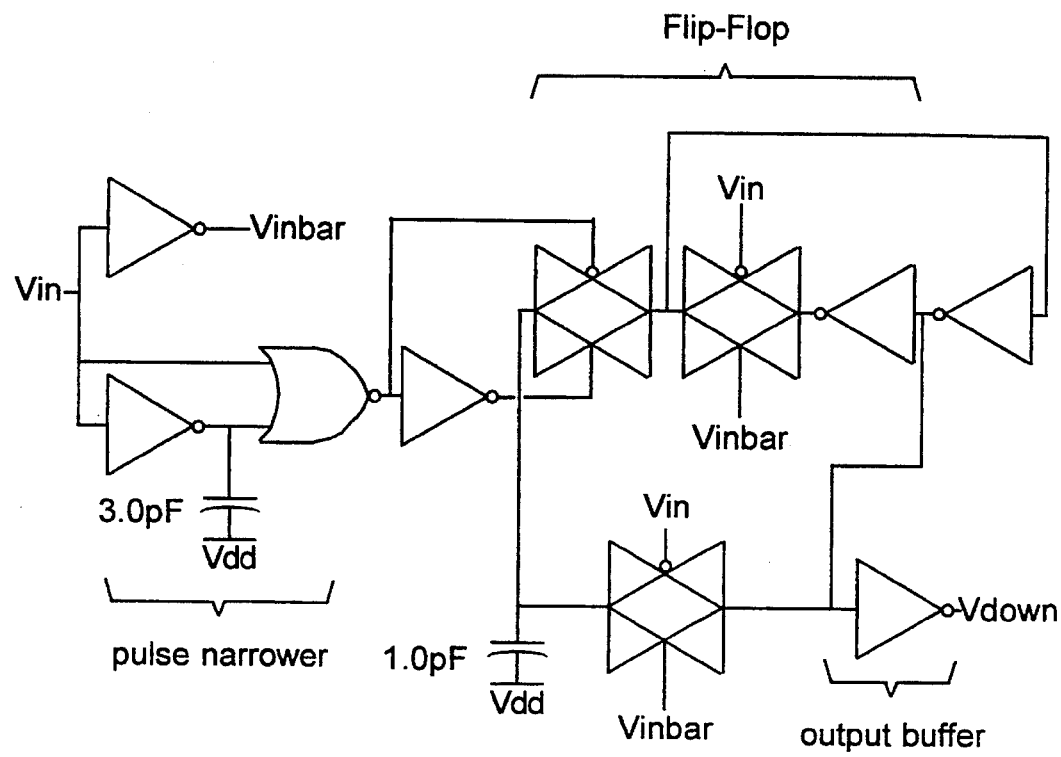
FIG. 9 is a schematic of a divide-down flip-flop circuit.
Figure 10:
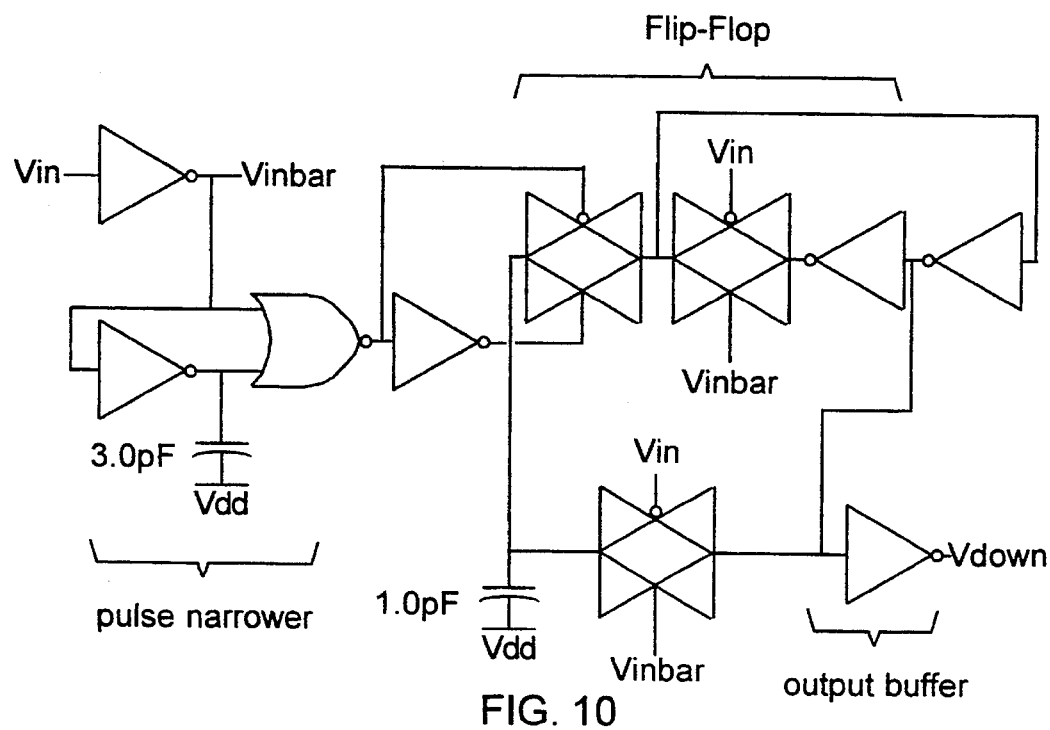
FIG. 10 is a schematic of a divide-down phase shifted flip-flop circuit.

FIG. 9 is a schematic of a divide-down flip-flop circuit. FIG. 10 is a schematic of a divide-down phase shifted flip-flop circuit. These two circuits are digital circuits that produce a digital squarewave output. The circuit of FIG. 10 produces an output which is 90° phase shifted from the output of the circuit of FIG. 9. The divide-down flip-flop circuits of FIGS. 9 and 10 can be used as the flip-flops 32 and 34 shown in FIG. 4. The digital sqarewave output is attenuated and biased in the attenuate and bias circuitry 36 and 38.

FIG. 11(a) is a schematic of a wide range four quadrant Gilbert multiplier used in the analog wavelet chip. FIG. 11(b) is a symbol for this wide range four quadrant Gilbert multiplier. The output current is a multiplicative function of four differential inputs.

$$I_{out} = I_{bias} \tanh \frac{\kappa(V_{1+} - V_{1-})}{2V_T} \tanh \frac{\kappa(V_{2+} - V_{2-})}{2V_T}$$

In this case, $I_{bias}$ is computed from the bias voltage $V_{bias}$ in exactly the same manner as for the transconductance amplifier. Although the output undergoes nonlinear (tanh) compression at extreme values of differential input, the tanh function is approximately linear for small values of the input.

In the wavelet transform, we wish to multiply two signals together, both referenced to the same midrange (2.5 V) value; in this case V1+=V2+=Vref=2.5 V. V1- or Vin1 is one input signal, and V2- or Vin2 is the other input signal.

Figure 12:
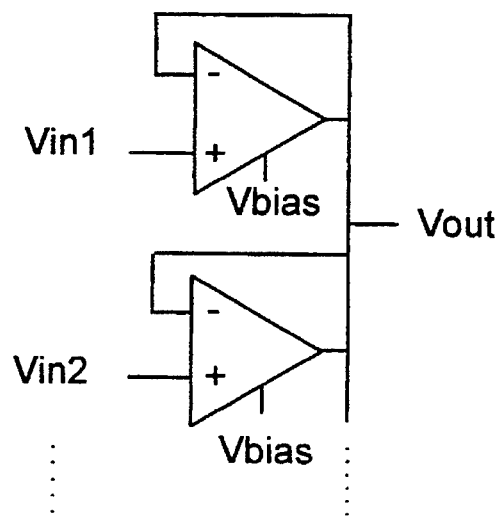
FIG. 12 is a partial schematic of a follower-aggregator (input averaging) circuit used in the analog wavelet chip.

FIG. 12 is a partial schematic of a follower aggregator of (input averaging) circuit used in the analog wavelet chip. This follower aggregator is used to add the reconstituted real and imaginary analog wavelet outputs to form the reconstituted analog input signal. This circuit is shown as summer 56 in FIG. 4.

While each amplifier in the aggregator attempts to follow its own input, the aggregator's output is pulled to an average value of all the amplifier's inputs. The outputs may be tied together because in that arrangement the current outputs from each amplifier adjust to make the total current zero according to Kirchoff's law. Each input can be weighted in relation to the others by adjusting the bias voltage on the associated amplifier. For the purposes of the wavelet chip, we always want a pure average, so the bias voltages of all the amplifiers are tied together. When this is done, the equation of the output is no longer a function of the bias voltage (which should therefore be set to some reasonable value such as 0.7 V to 0.8 V), but is simply $$V_{out} = \frac{1}{n} \sum_{i=1}^{n} V_{in_i}$$

Figure 13:
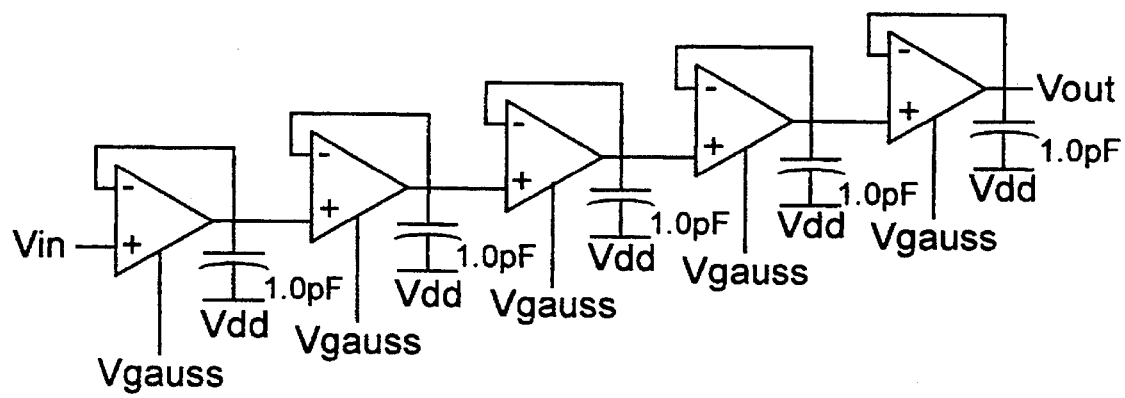
FIG. 13 is a schematic of a five-stage filter approximating a half-Gaussian function used in the analog wavelet chip.

FIG. 13 is a schematic of a five-stage filter approximating a half Gaussian function used in the analog wavelet chip. The equations relating to the width of the substantially half-Gaussian filter are discussed above. The parameter τ used in those equations is the same τ as is computed for any follower-integrator, τ=C/$g_m$, where C is the capacitance of each stage, approximately 1.0 pF, and $g_m$ is the transconductance of the amplifier. For the five stages of this filter, we assume that the amplifiers and capacitors are matched, such that the τ for the whole filter is the same as the τ for any given BW. The relation between τ and $V_{gauss}$ is given by $$V_{gauss} = \frac{V_T}{\kappa} \ln\left(\frac{2CV_T}{I_0\kappa\tau}\right)$$

Figure 14:
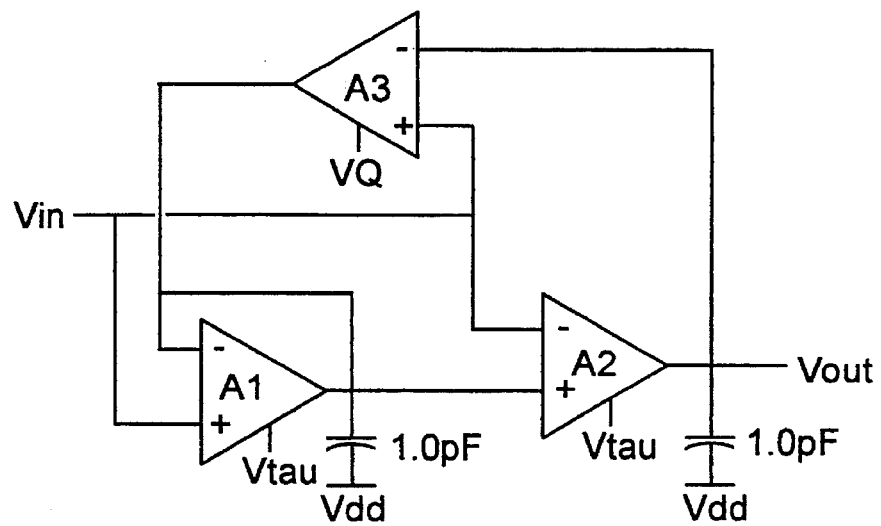
FIG. 14 is a schematic of a second order section low-pass filter.

FIG. 14 is a schematic of a second order section low pass filter. The second order section is used to produce a sinusoidal wave from a square wave input. The second order section 64 is shown in FIG. 5.

The purpose of the second-order section is to act as a low-pass filter with a fairly sharp cutoff frequency. The input-to-output transfer function of the second-order section is:

$$\frac{V_{out}}{V_{in}} = \frac{1}{\tau^2 s^2 + 2\tau s(1-\alpha) + 1}$$

The parameters are related to the input bias voltages $V\tau$ and VQ according to the following equations:

$$\tau = \frac{C_1}{g_{m1}} = \frac{C_2}{g_{m2}}$$

$$\alpha = \frac{g_{m3}}{g_{m1} + g_{m2}}$$

$$g_{m3} = \frac{I_0 \kappa}{2V_T} e^{\frac{V_Q \kappa}{V_T}}$$

$$g_{m1} = g_{m2} = \frac{I_0 \kappa}{2V_T} e^{\frac{V_\tau \kappa}{V_T}}$$

where gm1, gm2, and gm3 are the transconductances of the amplifiers labeled A1, A2, and A3 respectively. The analog wavelet chip has pins to set the voltages $V_{\tau H}$ and $V_{QH}$ for the "slices" 26 and 28 in FIG. 4, corresponding to $\omega_{c6}$=9 kHz in the preferred embodiment, and has pins to set $V_{\tau L}$ and $V_{QL}$ for "slices" 25 and 27, corresponding to $\omega_{c1}$=281.25 Hz in the preferred embodiment. The voltages $V_\tau$ and $V_Q$ for each of the four intervening pairs of "slices" are set using polysilicon strips in an analogous manner to that shown in FIG. 16.

Figure 15:
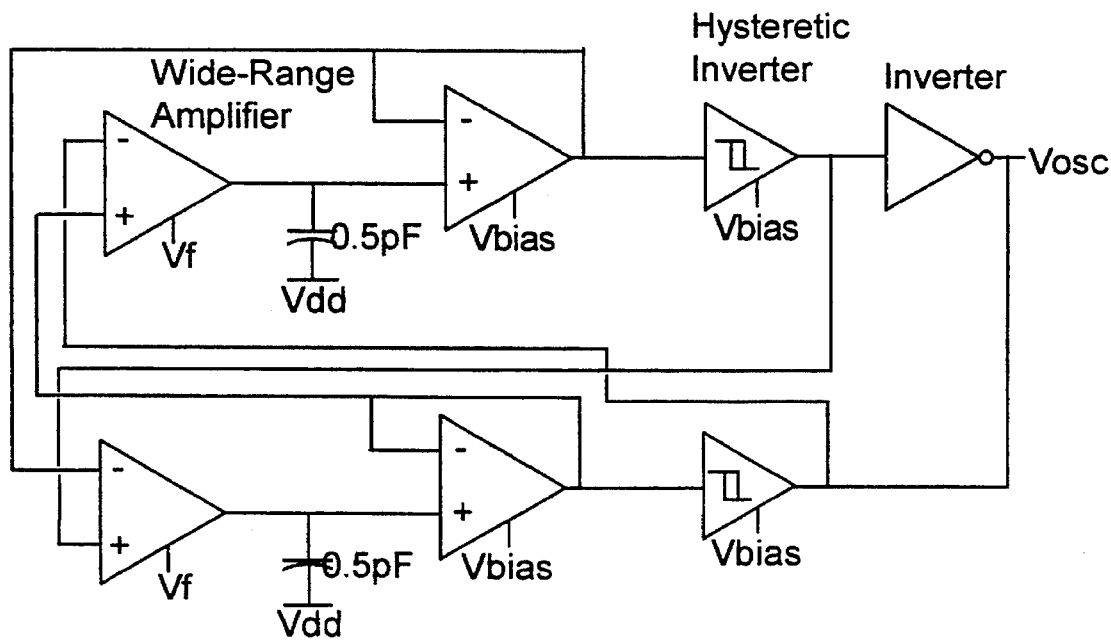
FIG. 15 is a schematic of a low-power voltage-controlled oscillator used in the analog wavelet chip.

FIG. 15 is a schematic of a low power voltage controller oscillator used in the analog wavelet chip. This voltage control oscillator is used to produce the square wave that is sent to the flip-flops used in forming the modulating signals.

FIG. 15 shows the voltage-controlled oscillator used in this circuit. This circuit actually consists of two oscillators; each oscillator controls the behavior of the other, so that the frequency will drift only half as much as it would for a single oscillator. The frequency f of the oscillator is proportional to the exponential bias voltage $V_1$. Empirical results from simulation give an equation for frequency vs. bias voltage as:

$$V_f = (0.1065) \ln(f+1)$$

The desired voltage $V_1$ is that which produces a frequency f two times higher than the desired highest center frequency (the frequency of the first demodulating cosine/sine waves).

While the invention has been described by reference to various embodiments, it will be understood that various modifications may be made without departing from the scope of the invention, which is to be limited only by the appended claims.

What is claimed is:

1. An analog circuit comprising:

modulating means for modulating a input signal with sinusoidal signals of different frequencies to form analog modulated signals, and a bank of analog filters connected to receive said analog modulated signals from said modulating means, said bank of analog filters producing a multiplicity of analog wavelet outputs, said bank of analog filters comprising substantially half-Gaussian shaped filters.

2. The analog circuit of claim 1, wherein each filter of said bank of analog filters comprises a cascade of a number of follower-integrators.

3. The analog circuit of claim 1, wherein said modulating means comprises multipliers.

4. The analog circuit of claim 1 further comprising sinusoidal signal production means for producing said sinusoidal signals, said sinusoidal signal production means comprising divide-by-n circuits and low pass filters in a manner that the sinusoidal signals have frequencies that differ on a logarithmic scale.

5. The analog circuit of claim 4, wherein said sinusoidal signal production means further includes an oscillator.

6. The analog circuit of claim 4, wherein said sinusoidal signal production means further includes attenuate and bias circuitry.

7. The analog circuit of claim 4, wherein said sinusoidal signal production means includes phase shifting circuitry to produce two sinusoidal signals with each of the frequencies wherein one of the two sinusoidal signals is phase shifted from the other of the two sinusoidal signals.

8. The analog circuit of claim 1, further comprising circuitry for forming a reconstituted analog input signal from a multiplicity of analog signals.

9. The analog circuit of claim 8, wherein said reconstituted input signal forming circuitry comprises multipliers and summers.

10. The analog circuit of claim 9, further comprising a sinusoidal signal producing means for producing sinusoidal signals, wherein said multipliers receive said sinusoidal signals and said multiplicity of analog signals.

11. The analog circuit of claim 8, further comprising a sampler for sampling said analog wavelet outputs, an processor for encoding the sampled output and for decoding the sampled output to produce said multiplicity of analog signals.

* * * * *